United States Patent [19]

Yamada et al.

[11] Patent Number: 5,051,376
[45] Date of Patent: Sep. 24, 1991

[54] METHOD FOR PRODUCING SEMICONDUCTOR DEVICE AND SEMICONDUCTOR DEVICE PRODUCED THEREBY

[75] Inventors: Yutaka Yamada; Toshihiko Ibuka; Fumio Orito, all of Tsuchiura; Yuichi Seta, Tokyo; Shin-ichiro Kawabata, Tsuchiura, all of Japan

[73] Assignees: Mitsubishi Monsanto Chemical Co, Ltd.; Mitsubishi Chemical Industries, Ltd., both of Tokyo, Japan

[21] Appl. No.: 463,642

[22] Filed: Jan. 11, 1990

Related U.S. Application Data

[62] Division of Ser. No. 146,839, Jan. 22, 1988, abandoned.

[30] Foreign Application Priority Data

Jan. 26, 1987 [JP] Japan ................................. 62-15839
Sep. 9, 1987 [JP] Japan ................................ 62-225746

[51] Int. Cl.$^5$ .................. H01L 21/265; H01L 21/324
[52] U.S. Cl. ........................................ 437/22; 437/41; 437/247; 437/248; 437/912; 437/487; 437/184; 156/605
[58] Field of Search ....................... 437/20, 22, 25, 40, 437/41, 175, 176, 184, 247, 248, 912, 939, 987; 148/DIG. 56, DIG. 65, DIG. 3, 33; 156/605, 616.1, 616.2, 616.3, 616.4, 617.1, 620.1, 620.2

[56] References Cited

U.S. PATENT DOCUMENTS

| | | | |
|---|---|---|---|
| H291 | 6/1987 | Boos | 156/643 |
| 4,158,851 | 6/1979 | Akai et al. | 148/33 |
| 4,233,613 | 11/1980 | Morimoto | 156/DIG. 103 |
| 4,505,023 | 3/1985 | Tseng et al. | 437/41 |
| 4,528,061 | 7/1985 | Miyazawa et al. | 156/605 |
| 4,544,417 | 10/1985 | Clarke et al. | 437/247 |
| 4,594,173 | 6/1986 | Hobgood | 156/605 |
| 4,595,423 | 6/1986 | Miyazawa et al. | 437/27 |
| 4,602,965 | 7/1986 | McNally | 437/912 |
| 4,636,280 | 1/1987 | Nakai et al. | 437/248 |
| 4,713,354 | 12/1987 | Egawa et al. | 437/247 |
| 4,738,934 | 4/1988 | Johnston, Jr. et al. | 437/247 |
| 4,752,592 | 6/1988 | Tamura et al. | 437/247 |
| 4,759,822 | 7/1988 | Vetanen et al. | 437/184 |

OTHER PUBLICATIONS

Kirkpatrick et al., "Growth of Bulk GaAs", in *Gallium Arsenide* edited by Howes and Morgan, John Wiley & Sons, Inc., 8/29/85.
Molnar et al., "Comparison of Heat-Pulse and Furnace Isothermal Anneals of Be Implanted InP", in *Ion Implantation and Ion Beam Processing of Materials*, edited by Hubler, Holland, Clayton and White, Elsevier Science Publishing Co., Inc, 1984.
Miyazaki et al., "Implantation of Silicon Into Gallium Arsenide", in *Ion Implantation in Semiconductors Science and Technology*, edited by Namba, Plenum Press, 1975.
Bonnet et al., "Homogeneity of Lec Semi-Insulating GaAs Wafers for IC Applications", GaAs IC Symposium, IEEE Gallium Arsenide Integrated Circuit Symposium, Technical Digest, 1982, pp. 54–57.
Takebe et al., "Characterization of In-Mixed Dislocation Free GaAs Crystals for IC Application", Inst. Phys. Conf. Ser. No. 79: Chapter 4, Paper presented at Int. Symp. GaAs and Related Compounds, Karvizawa, Japan, 1985, pp. 283–300.
Gray et al., "The Role of Crystal-Growth Properties on Silicon Implant Activation Processes for GaAs", J. Appl. Phys., vol. 64, No. 3, Aug. 1, 1988, pp. 1464–1467.
Inada et al., "Ion Implantation in In-Doped, Semi-Insulating Gallium Arsenide", Nuclear Instruments and Methods in Physics B19/20 (1987), pp. 413–417.
Barrett et al., "Large Diameter Bulk GaAs Material for Microwave Device Technology", Proceedings of the Fourth Biennial University/Government/Industry Microelectronics Symposium, 1981, pp. XI 29–36.
Ta et al., "Reproducibility and Uniformity Considerations in LeC Growth of Undoped, Semi-Insulating GaAs for Large-Area Direct Implanation Technology", Inst. Phys. Conf. Ser. No. 65: Chapter 1; Paper presented at Int. Symp. GaAs and Related Compounds, Albuquerque, 1982, pp. 31–39.

*Primary Examiner*—Olik Chaudhuri
*Assistant Examiner*—M. Wilczewski
*Attorney, Agent, or Firm*—Burgess, Ryan & Wayne

[57] ABSTRACT

A method for producing a semiconductor device comprises the steps of: preparing a III$_b$ -V$_b$ group compound single crystalline semiconductor substrate produced by a liquid encapsulated Czochralski process, the single crystalline semiconductor substrate having a carbon concentration of $1 \times 10^{15}$ cm$^{-3}$ or less, implanting conductive impurity ions into the single crystalline semiconductor substrate and then annealing, and a semiconductor device produced by this method.

4 Claims, No Drawings

METHOD FOR PRODUCING SEMICONDUCTOR DEVICE AND SEMICONDUCTOR DEVICE PRODUCED THEREBY

This is a division of application Ser. No. 146,839, filed Jan. 22, 1988, now abandoned.

BACKGROUND OF THE INVENTION

1. Field of the Invention

The present invention relates to a method for producing a semiconductor device and a semiconductor device produced by that method. More particularly, it relates to a method for producing a semiconductor device having a single crystalline substrate consisting of a III$_b$-V$_b$ group compound, and the semiconductor device produced thereby.

2. Description of the Related Art

Since in a single crystalline substrate of a III$_b$-V$_b$ group composition such as GaAs, Ga$_{1-x}$In$_x$As ($0.001 \leq x \leq 0.01$), InP, etc., the electron mobility is large, it is used for a production of field effect transistors (FET's) used in a high frequency zone, analog IC's, and high speed digital IC's, among others. The III$_b$-V$_b$ group compound is hereinafter referred to as the III-V composition.

The semiconductor device is produced by the steps of, preparing a single crystalline substrate having a III-V composition, implanting conductive impurities into the substrate, and annealing the implanted substrate to activate the same. This method is well known as an ion implanting process having a higher productivity than other processes, such as an epitaxial growth process.

In the ion implanting process for producing such a semiconductor device, a semi insulating substrate having a specific resistivity of $1 \times 10^7$ Ω·cm or more is used, as this ensures that each IC component element can be easily electrically isolated.

However, in a conventional semiconductor device produced by using the semi insulating substrate such as GaAs or Ga$_{1-x}$In$_x$As, when the semi-insulating is annealed after ion implantation, the specific resistivity of the substrate is decreased with the result that the isolation of the component elements becomes unsatisfactory, and further, after the ion implantation, the ion activity in one substrate or further substrates becomes nonuniform. Therefore, the production yield of these semiconductor devices is lowered.

The annealing process in the above-mentioned ion implanting process for producing a semiconductor process is carried out by a process using a known resistivity heating furnace insulated by rock wool, etc., and a lamp annealing process using an infrared ray lamp wherein a substrate is irradiated with rays having an incoherent property, to heat the surface of the substrate.

In the conventional annealing process, heat conditions are well known but the effects of the cooling after the annealing were unknown. Namely, after the annealing, the specific resistivity of non-ion-implanted portions is not sufficiently improved, with the result that the specific resistivity becomes less than an aimed $1 \times 10^7$ Ω·cm, and thus the electrical isolation between each component element of IC becomes unsatisfactory.

SUMMARY OF THE INVENTION

It is an object of the present invention to provide a method for producing a semiconductor having a III-V group single crystalline substrate, and the semiconductor produced thereby, wherein an electric isolation between each component element of the IC is improved and a high production yield obtained.

It is another object of the present invention to provide a method for producing a semiconductor having a III-V group single crystalline substrate, and the semiconductor produced thereby, wherein the implanted ion activation ratio is enhanced. According to the present invention, there is provided a method for producing a semiconductor device comprising the steps of:

preparing a III$_b$-V$_b$ group compound single crystalline semiconductor substrate produced by a liquid encapsulated Czochralski process, the semiconductor single crystalline substrate having a carbon concentration of $1 \times 10^{15}$ cm$^{-3}$ or less, implanting conductive impurity ions into the single crystalline semiconductor substrate, and annealing the substrate.

Further, there is provided a method for producing a semiconductor device comprising the steps of:

preparing a III$_b$-V$_b$ group compound single crystalline semiconductor substrate produced by a liquid encapsulated Czochralski method, the single crystalline semiconductor substrate having a carbon concentration of $1 \times 10^{15}$ cm$^{-3}$ or less implanting conductive impurity ions into the single crystalline semiconductor substrate, annealing the substrate at a temperature of about 800° to about 1000° C. for about 2 to about 15 minutes, and allowing the substrate to cool to 600° C. or less at a cooling rate of 0.29° C./sec to 90° C./sec.

Still further, there is provided a semiconductor device produced by a method for producing a semiconductor device comprising the steps of:

preparing a III$_b$-V$_b$ group compound semiconductor single crystalline substrate produced by a liquid encapsulated Czochralski method, the single crystalline semiconductor substrate having a carbon concentration of $1 \times 10^{15}$ cm$^{-3}$ or less, implanting conductive impurity ions into the single crystalline semiconductor substrate, and annealing the substrate.

DESCRIPTION OF THE PREFERRED EMBODIMENTS

The preferred embodiments of the present invention will now be described.

The single crystal used as a substrate of the semiconductor of the present invention is produced by a liquid encapsulated method, by which a high purity single crystal can be easily obtained.

In the present invention, a III-V group compound single crystal of, for example, gallium arsenide (GaAs), gallium indium arsenide (Ga$_{1-x}$In$_x$As ($0.001 \leq x \leq 0.01$), indium phosphorus (InP), and the like, is used. Preferably, the single crystal has a high degree of purity, and particularly, the carbon concentration is less than $1 \times 10^{15}$ cm$^{-3}$. When the carbon concentration is greater than $1 \times 10^{15}$ cm$^{-3}$ the deviation of the specific resistivity after an annealing process is increased and thus the activation ratio of implanted impurity ions becomes nonuniform. When the carbon content is less than $5 \times 10^{14}$ cm$^{-3}$, the deviation of the specific resistivity after annealing is still decreased but the activation ratio of implanted impurity ions becomes more uniform.

In the present specification, the carbon concentration of a single crystalline substrate is obtained by an absorption (about 580 cm$^{-1}$) strength due to a stretching vibration of the connection between carbon atoms and gallium atoms, as follows.

Namely, as the spectrophotometer, a double beam type Fourier transformation frared spectrophotometer is used in such a manner that a GaAs or $Ga_{1-x}In_xAs$ single crystal not including carbon is provided in one beam, and a GaAs or $Ga_{1-x}In_xAs$ single crystal to be measured is provided in the other beam, and the above-mentioned absorption strength is measured at room temperature. In this measurement, two single crystals having the same thickness are used. Note, the single crystal not including carbon is obtained by a boat grown method using a quartz boat.

When an absorbance of absorption (580 cm$^{-1}$) due to a gallium-carbon stretching vibration is referred to as A, the absorbance at a cross point formed by a straight line connecting the middle values of the noise levels of two adjacent sides (about 579 and 581 cm$^{-1}$) of the above absorption, and a wave number axis, is referred to as B, and the thickness of the gallium arsenide single crystal is expressed as t (cm). The unit [c] expressed by the following equation is defined as a carbon concentration (unit: cm$^{-3}$), $$[c] = 1.2 \times 10^{16} \times \{(2.3/t) \times (A - B)\}$$

Resistivity of a single crystal substrate is a range of from $1 \times 10^3$ to $1 \times 10^7$ Ω·cm is preferable. Preferably, a mixed crystal ratio for the gallium indium arsenide ranges from 0.001 to 0.01, because a single crystalline substrate has a lower etch pit density. In this specification, the mixed crystal ratio is denoted by x in the expression, $Ga_{1-x}In_xAs$.

The single crystalline substrate of the present invention is produced by cutting a single crystal produced by the above-mentioned liquid encapsulated Czochralski method, wherein gallium concentration is advantageously 49 to 52% (molar ratio)

An ion implantation is carried out by a known process. The ion implanting quantity preferably ranges from $1 \times 10^{11}$ to $1 \times 10^{15}$ cm$^{-2}$, more preferably, from $5 \times 10^{11}$ to $5 \times 10^{12}$ cm$^{-2}$. Note, as the n type ion Si, S, Se, Te and the like, are used. Further, as the p type ion, Mg, Be, Zn, Cd and the like, are used.

After the ion implantation, the ion implanted substrate is annealed to activate the implanted ions and eliminate damage to the substrate caused by the ion implantation.

The annealing process is carried out by maintaining the substrate at a desired temperature for a desired time. For example, an ion implanted substrate is preferably maintained at a temperature of about 800° to about 1000° C. for about 2 to 15 minutes, and then cooled. When the annealing temperature is less than about 800° C. the annealing effects are insufficient. On the other hand, when the annealing temperature is higher than about 1000° C., a vaporization of the $V_b$ group element, for example, As, increases.

In addition, when the heating time is less than about 2 sec, the annealing effects are in sufficient. On the other hand, when this time is longer than about 15 minutes, the vaporization of $V_b$ group and a heat diffusion of the implanted ions disadvantageously occur.

To prevent the above vaporization of As, the annealing is preferably carried out in an atmosphere including As, or the substrate surface is covered by a densed film such as siliconnitride ($SiN_x$), $SiO_2$, AlN film.

After heating the substrate under the above mentioned conditions, the substrate is preferably cooled at a cooling rate of 0.29° to 90° C./sec. When the cooling rate is less than 0.29° C./sec, the annealing effects are insufficient. On the other hand, when the cooling rate is greater than 90° C./sec, the specific resistivity is disadvantageously decreased. The cooling rate is maintained until the temperature of the substrate becomes less than at least 600° C. This is because, until the substrate temperature becomes less than 600° C, the annealing is in progress.

Although the cooling rate after the substrate temperature becomes less than 600° C. is not particularly restricted, it is preferably kept within the above-mentioned range.

As the heating device for the annealing, a heater having a small heat capacity is preferably used. Use of such a heater enables an efficient control of the cooling rate after the substrate is heated. Examples of the heater to be used are, an incoherent light source such as an infrared ray lamp, and a gold furnace wherein a quartz furnace core pipe is wound by a resistivity wire and the furnace core pipe is provided in a gold plated quartz pipe for insulation.

After the annealing process, the annealed substrate is subjected to the usual processes, such as electrode formation, chip isolation, bonding of lead wires, packaging, etc., so that a schottky barrier diode, a gun diode, a hall element, an FET, a digital IC, and an analog IC, etc., are produced.

According to the present invention an electric isolation between, e.g., the IC's, is improved and the production yield of the semiconductor is increased. Further, according to the present invention the activation ratio of the implanted ions is increased due to the sheet carrier concentrations of the ion implanted portions.

The present invention will now be described in detail, with reference to examples and comparative examples.

The specific resistivities in the following examples and comparative examples were measured by a three electrode guard method described in Japan J. Appl. Phy. 23, pp 602 to 605 (1984).

The sheet carrier concentration and mobility were measured by a Van Der Pauw method.

The activation ratio is expressed by a percentage of a value obtained by dividing the sheet carrier concentration by an implanted quantity of impurities.

The deviation of the activation ratio is expressed by a percentage of a value obtained by dividing a standard deviation (o) by an average value (x).

The deviation of a threshold voltage (Vth) of a field effect transistor is expressed by the o value.

Etch pit densities were measured by observing samples by a microscope after etching by molten potassium hydroxide. As the samples for measuring the carbon concentration, the specific resistivity and the etch pit density, substrates cut from portions of a single crystal near the substrate used for the semiconductor devices were used.

EXAMPLE 1

Production of Hall Elements

A gallium arsenide (GaAs) bulk single crystal was grown by a liquid encapsulated Czochralski method (LEC method) from a gallium arsenide melt containing 51.5% (molar ratio) gallium. The obtained GaAs bulk single crystal was then annealed at a temperature of 950° C. for 20 hours in a sealed quartz tube having a gallium pressure of 6 mmHg. A single crystal substrate having a diameter of 7.5 cm and a (100) surface orientation was then cut from the annealed bulk single crystal. The carbon concentration and etch pit density of the cut substrate portion near the above-mentioned cut substrate were $3 \times 10^{14}$ cm$^{-3}$ and $2 \times 10^4$ cm$^{-2}$ respectively. The specific resistivity, measured at twenty positions on a substrate surface, were 6 to $8 \times 10^5$ Ω·cm.

An implantation of $^{29}$Si$^+$ ions was then made into the half surface of the surface at an energy of 60 KeV and a dose of $5 \times 10^{12}$ cm$^{-2}$.

After the ion implantation, the substrate was annealed at a temperature of 820° C. for 10 minutes in a hydrogen atmosphere containing 0.3 volume % of arsine.

After the annealing, an electrode pattern of a hall element was formed on the ion implanted portion of the substrate by a well known photolithography process. On a non-ion-implanted portion was formed an electrode for measuring a specific resistivity by a three electrode guard method. Then, after depositing Au-Ge alloy, resist films were lifted off and an alloying treatment was carried out to form electrodes.

After forming the electrodes, a Hall element forming portion was mesa etched to isolate the Hall elements from each other, and thus 3600 Hall elements and elements for a three electrode guard method were formed.

1) The results obtained by the three electrode guard method at the non-ion-implanted portion were as follows:
Specific resistivity value:

$3.5 \times 10^7$ Ω·cm (average)

Ratio of elements having a specific resistivity of $1 \times 10^7$ Ω·cm or more: 98.8%

2) The results obtained by the Van Der Pauw process at the ion implanted portion were as follows:
Sheet carrier concentration:

$1.35 \times 10^{12}$ cm$^{-2}$ (average)

Activation ratio: 27%
Deviation of activation ratio: 2.5%
Electron mobility: 4300 cm$^2$/V·sec

EXAMPLE 2

Production of Hall elements

A GaAs bulk single crystal was grown by the LEC method from a GaAs melt containing a 50.5% (molar ratio) galium. As samples single crystalline substrate having a diameter of 7.5 cm were cut from the bulk single crystal which had not been annealed. The surface orientation of the substrate surface was (100).

Hall elements were produced by using the substrate and the same process as used in example 1 in other steps.

A carbon concentration and an etch pit density of a sample cut from a substrate portion near the above-mentioned cut portion of substrate were $5 \times 10^{14}$ cm$^{-3}$ and $1.5 \times 10^4$ cm$^{-2}$ respectively. The specific resistivities measured at twenty positions on a substrate surface were 1.5 to $2.0 \times 10^6$ Ω·cm.

1) The results obtained by the three electrode guard method at the non-ion-implanted portion were as follows:
Specific resisntace value:

$4.1 \times 10^7$ Ω·cm (average)

Ratio of elements having a specific resistivity of $1 \times 10^7$ Ω·cm or more: 98.5%

2) The results obtained by the Van Der Pauw process at the ion implanted portion were as follows:
Sheet carrier concentration:

$1.25 \times 10^{12}$ cm$^{-2}$ (average)

Activation ratio: 25%
Deviation of activation ratio: 4.5%
Electron mobility: 4250 cm$^2$/V·sec

EXAMPLE 3

Production of FETs

A GaAs single crystalline substrate having a diameter of 7.5 cm and a surface orientation of (100) which was cut from the same GaAs single crystal as used in Example 1.

The carbon concentration, the etch pit density, and the specific resistivity were the same as in Example 1.

An ion implantation was carried out by the two step process. Namely, in the channel portion, $^{29}$Si$^+$ ions were implanted at an implanting energy of 50 KeV and a dose of $1.3 \times 10^{12}$ cm$^{-2}$, and in the source and drain electrode forming portion, $^{29}$Si$^+$ ions were implanted at an implanting energy of 150 KeV and a dose of $2 \times 10^{13}$ cm$^{-2}$, to ensured good ohmic contact.

After the ion implantation, annealing was carried out under the same condition as used in Example 1, the patterns of the source and a drain electrodes were formed by a photolithography process, and Au-Ge alloy was deposited. After lifting off the resist films, an alloying treatment was performed to form the source and drain electrodes, platinum (Pt) was then deposited on a gate electrode to form a Schottky barrier gate.

Thus, 7200 FETs having a gap of 0.5 mm therebetween were formed on the GaAs substrate. The gate length of the obtained FET's was 1 μm and the gate width was 20 μm.

The Vth, the deviation of the Vth, and mutual conductance (gm) were as follows.
Vth: −0.82 (average), deviation: 40 mV
gm: 80 mS/mm

COMPARATIVE EXAMPLE 1

Production of Hall Elements

In this example a GaAs single crystalline substrate having a carbon concentration of $2.0 \times 10^{15}$ cm$^{-3}$, an etch pit density of $1.8 \times 10^4$ cm$^{-2}$, and a specific density of 1.5 to $2.5 \times 10^8$ Ω·cm (at 20 positions), and further having a diameter of 7.5 cm and a surface orientation of (100), was used, and Hall elements were produced by the same conditions as used in Example 1, except for the above changes.

1) The results obtained by the three electrode guard method at the non-ion-implanted portion were as follows:
Specific resistivity value:

$8.0 \times 10^6$ Ω·cm (average)

Ratio of elements having a specific resistivity $1 \times 10^7$ Ω·cm or more: 0.5%

2) The results obtained by the Van Der Pauw process at the ion implanted portion were as follows:
Sheet carrier concentration:

$7.5 \times 10^{11}$ cm$^{-2}$ (average)

Activation ratio: 15%
Deviation of activation ratio: 10%
Electron mobility: 3600 cm$^2$/V.sec

COMPARATIVE EXAMPLE 2

Production of FETs

A GaAs single crystalline substrate cut from a GaAs single crystal near the GaAs substrate used in above comparative example 1 was used, and under the conditions used in Example 3, an FET was produced.

The carbon concentration, etch pit density, and specific resistivity obtained were the same as produced in the comparative Example 1.

Further, the obtained Vth, the deviation thereof and the gm of the produced FET were as follows:
Vth: 0.30 V (average)
Deviation of Vth: 60 mV
gm: 35 mS/mm (average)

EXAMPLE 4

GaAs single crystal substrates were cut from three GaAs crystals having different specific resistivities, a diameter of 75 mm which crystals and a carbon concentration of $4 \times 10^{14}$ cm$^{-3}$, were grown by the LEC process. The (100) plane direction of the substrate surface was used.

After planishing, the substrate $^{29}$Si+ ions were implanted into the half surface thereof to form a Hall element, at an implanting energy of 60 KeV and a dose of $5 \times 10^{12}$ cm$^{-2}$.

After the ion implantation, the ion implanted substrate was annealed at a temperature of 820° C. for 10 minutes, under a hydrogen atmosphere containing 0.3 volume % AsH$_3$ by using a gold furnace. After the annealing the GaAs substrate was cooled to 600° C. at a cooling rate of 0.32° C./sec.

On the obtained ion implanted portion of the substrate were formed electrodes for a Hall element, at a 500 μm pitch. On the non-ion-implanted portion of the substrate, electrodes for measuring specific resistivity were formed at a pitch of 500 μm. Then, the specific resistivity sheet carrier concentration and the electron mobility were measured, and the results were as shown in Table 1.

EXAMPLE 5

In this example substrates cut from the three GaAs single crystals used in Example 4 were used. The substrates were cut from portions near the positions from which the substrates of Example 1 were cut.

Ion implantation was carried out in the same manner in Example 1, to form a Hall elements on each half surface of each substrate.

After the ion implantation, the ion implanted substrates were annealed at a temperature of 850° C. for 30 sec. under a hydrogen atmosphere containing 0.3% AsH$_3$. After the annealing, the substrates were cooled to 600° C. at a cooling rate of 83° C./sec.

The same electrodes as in Example 4 were formed, and the specific resistivity and sheet carrier concentration, etc., were measured. The results were as shown in Table 1.

COMPARATIVE EXAMPLE 3

In this example, substrates cut from portions near positions from which the substrates used in Example 5, were used. A usual resistivity heating type diffusion furnace was used for the annealing. The cooling was carried out at a cooling rate of 0.1° C./sec, and the other process conditions were the same as in Example 4.

TABLE 1

| Non-ion implanted layer | | Ion implanted layer | | |
|---|---|---|---|---|
| Specific resistivity before annealing (Ω·cm) | Specific resistivity after annealing (Ω·cm) | Sheet carrier concentration activation ratio (cm$^{-2}$) | Activation ratio (%) | Electron mobility (cm$^2$/V·sec) |
| Example 4 | | | | |
| $2.2 \times 10^5$ | $2.15 \times 10^7$ | $1.80 \times 10^{12}$ | 36.0 | 4150 |
| $1.1 \times 10^6$ | $2.52 \times 10^7$ | $1.52 \times 10^{12}$ | 30.4 | 4110 |
| $9.8 \times 10^6$ | $3.50 \times 10^7$ | $1.43 \times 10^{12}$ | 29.0 | 4100 |
| Example 5 | | | | |
| $2.2 \times 10^5$ | $3.52 \times 10^7$ | $1.85 \times 10^{12}$ | 37.0 | 4210 |
| $1.1 \times 10^6$ | $4.04 \times 10^7$ | $1.60 \times 10^{12}$ | 32.0 | 4180 |
| $9.8 \times 10^6$ | $5.02 \times 10^7$ | $1.52 \times 10^{12}$ | 30.4 | 4150 |
| Comparative Example 3 | | | | |
| $2.2 \times 10^5$ | $1.4 \times 10^6$ | $1.00 \times 10^{12}$ | 20.0 | 3910 |
| $1.1 \times 10^6$ | $3.3 \times 10^6$ | $0.95 \times 10^{12}$ | 19.0 | 3890 |
| $9.8 \times 10^6$ | $7.0 \times 10^6$ | $0.90 \times 10^{12}$ | 18.0 | 3850 |

As apparent from these results, according to the present invention, even after annealing, high specific resistivity and a high electrical isolation were obtained. Further the activation ratio of the implanted ions became high and the deviations thereof were small.

We claim:

1. A method for producing a semiconductor device comprising steps of:
   preparing a III$_b$-V$_b$ group compound single crystalline semiconductor substrate produced by a liquid encapsulated Czochralski method, said single crystalline semiconductor substrate having a carbon concentration of $1 \times 10^{15}$ cm$^{-3}$ or less,
   implanting conductive impurity ions into said single crystalline semiconductor substrate,
   annealing at a temperature of about 800° to about 1000° for about 2 to about 15 minutes, and
   cooling to 600° C. or less at a cooling rate of 0.29° C./sec.

2. A method according to claim 1, wherein said III-b-V$_b$ group compound semiconductor is selected from groups consisting of GaAs, Ga$_{1-x}$In$_x$As ($0.001 \leq x \leq 0.01$), and InP.

3. A method according to claim 1, wherein the specific resistivity of said substrate prior to the implanting and annealing steps is $1 \times 10^5$ to $1 \times 10^7$ Ω·cm.

4. A method according to claim 1, wherein the specific resistivity of the annealed substrate is $1 \times 10^7$ Ω·cm or more.

* * * * *